Figure 1:
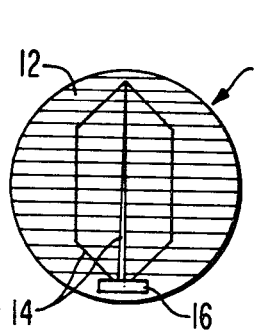

United States Patent [19]

Lazzery et al.

[11] 4,364,508
[45] Dec. 21, 1982

[54] METHOD OF FABRICATING A SOLAR CELL ARRAY

[75] Inventors: Angelo G. Lazzery, Oaklyn; Marvin S. Crouthamel, Pennsauken; Peter J. Coyle, Oaklyn, all of N.J.

[73] Assignee: The United States of America as represented by the United States Department of Energy, Washington, D.C.

[21] Appl. No.: 196,205

[22] Filed: Oct. 14, 1980

[51] Int. Cl.³ ................... H01L 21/98; H01L 21/70
[52] U.S. Cl. ...................................... 228/106; 29/572; 29/843; 228/180 A; 228/212
[58] Field of Search ............... 228/106, 180 A, 212; 29/572, 843

[56] References Cited

U.S. PATENT DOCUMENTS

| 3,565,719 | 2/1971 | Webb | 29/572 X |
|---|---|---|---|
| 3,571,915 | 3/1971 | Shirland | 29/572 |
| 3,837,924 | 9/1974 | Baron | 29/572 X |
| 3,973,996 | 10/1976 | Kennedy | 29/572 X |
| 4,067,764 | 1/1978 | Walker | 156/267 |
| 4,131,755 | 12/1978 | Keeling et al. | 136/244 |
| 4,132,570 | 1/1979 | Caruso et al. | 136/244 |
| 4,154,998 | 5/1979 | Luft et al. | 29/572 X |
| 4,184,903 | 1/1980 | Lovelace | 156/300 X |
| 4,287,382 | 9/1981 | French | 29/572 X |

Primary Examiner—Kenneth J. Ramsey

[57] ABSTRACT

A first set of pre-tabbed solar cells are assembled in a predetermined array with at least part of each tab facing upward, each tab being fixed to a bonding pad on one cell and abutting a bonding pad on an adjacent cell. The cells are held in place with a first vacuum support. The array is then inverted onto a second vacuum support which holds the tabs firmly against the cell pads they abut. The cells are exposed to radiation to melt and reflow the solder pads for bonding the tab portions not already fixed to bonding pads to these pads.

8 Claims, 9 Drawing Figures

U.S. Patent   Dec. 21, 1982   Sheet 1 of 2   4,364,508

METHOD OF FABRICATING A SOLAR CELL ARRAY

The U.S. Government has rights in this invention pursuant to Contract No. JPL PO954868 on RCA u/-NAS7-100 awarded by NASA.

The present invention relates to a method of fabricating solar cell arrays.

Of interest is copending application Ser. No. 196,273 filed on Oct. 14, 1980, now U.S. Pat. No. 4,350,836 entitled "Solar Array Construction and Process for Assembling Same" by Marvin Synder Crouthamel et al. and assigned to the assignee of this invention.

There is now an accelerated effort to produce solar cell arrays at a cost sufficiently low to be competitive with the costs of other sources of energy. It involves lowering the cost of the individual cells and the cost of fabrication of the cells into arrays. The present invention is directed to the latter effort.

In accordance with an embodiment of the present invention, pretabbed solar cells are assembled into an array with at least a part of each tab facing upward, each tab being fixed to a bonding pad on one cell and abutting a bonding pad on an adjacent cell. The array is then invented onto a second vacuum support means which holds the tabs firmly against the pads they abut. Then heat may be applied for bonding the tab portions not already fixed to the bonding pads to these pads.

Figure 2:
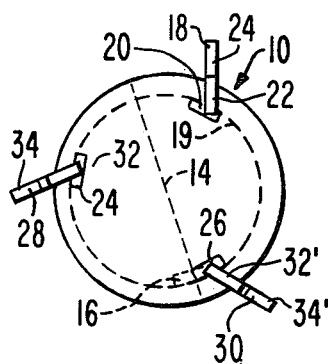
Figure 3:
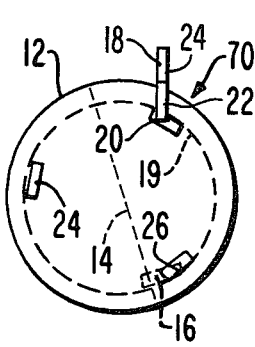
Figure 4:
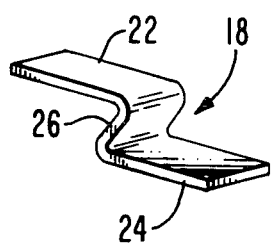
Figure 5:
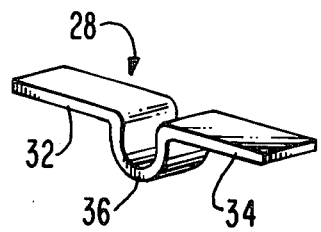
Figure 6:
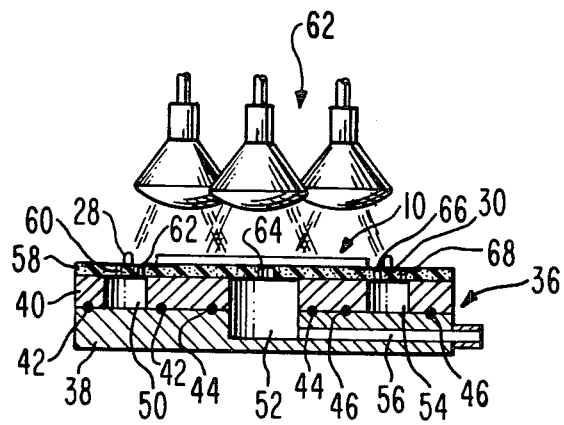
Figure 7:
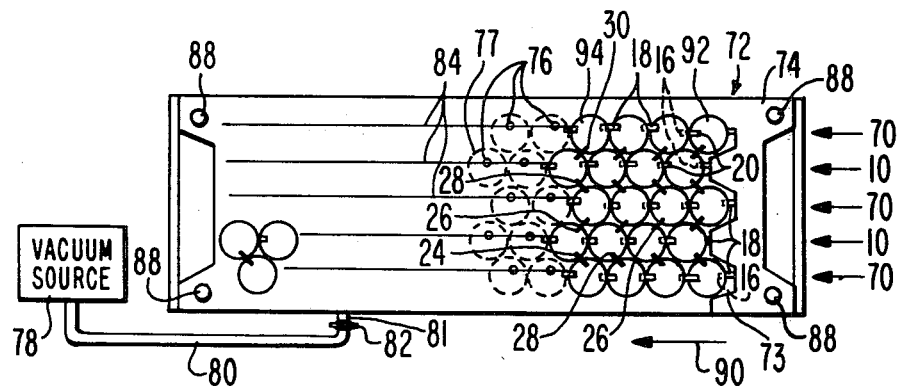
Figure 8:
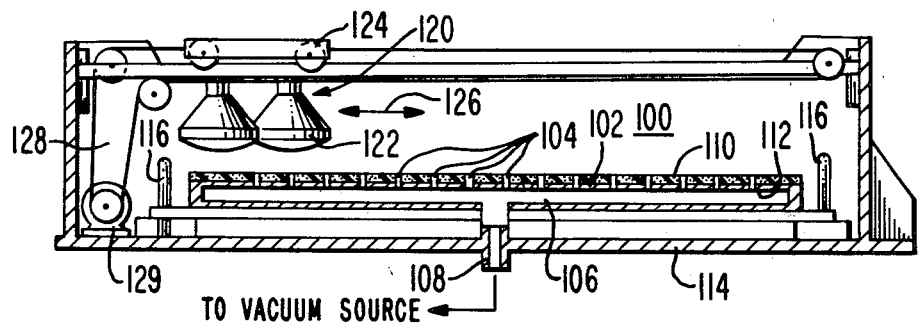
Figure 9:
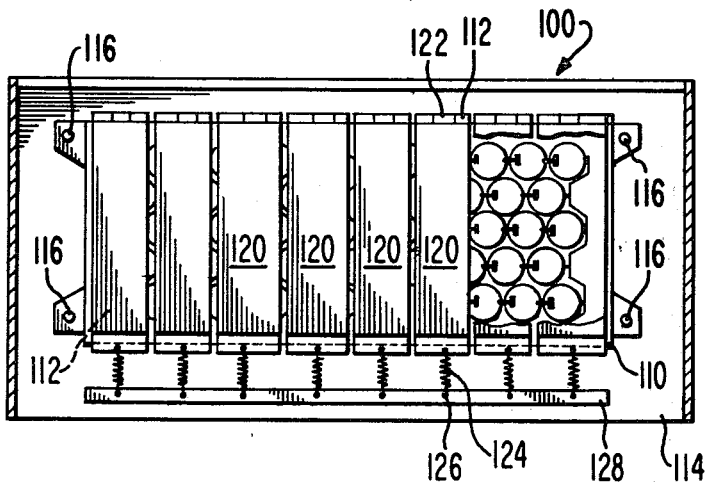

In the drawing:

FIG. 1 is a plan view of the emitter region of a solar cell employed in a preferred embodiment of the present invention, FIG. 2 is a plan view of the base region of one configuration of the cell of FIG. 1, FIG. 3 is a plan view of the base region of a second configuration of the cell of FIG. 1, FIG. 4 is an isometric view of a tab for interconnecting the cells of FIGS. 1, 2 and 3, FIG. 5 is an isometric view of a second tab used in connecting the cells of FIGS. 1, 2 and 3, FIG. 6 is a sectional view of an apparatus employed for connecting the tabs of FIGS. 4 and 5 to the cells of FIGS. 1, 2 and 3, FIG. 7 is a plan view of an apparatus employed for placing the cells into an array, and FIGS. 8 and 9 are, respectively, side sectional and plan sectional views of an apparatus employed for interconnecting the tabs of the different cells in a final interconnection step.

In FIG. 1, cell 10' comprises a wafer of relatively thin semi-conductor material having an emitter region for receiving solar radiation facing the viewer, and a base region facing into the drawing. A grid structure 12, comprising parallel conductive grid elements, is silkscreened onto the face of the emitter region. Bus conductors 14 extending across the central region of the cell, intersect all of the grid elements 12 for collecting the currents of the grid elements and transferring them to solder pad 16 at one end of the bus conductors. The bus conductors 14 and solder pad 16 may be silkscreened onto the emitter region surface of the cell.

The cells employed in the array to be constructed by the present method all have a grid structure as illustrated in FIG. 1; however, the base region of the cells has one of two different interconnection arrangements. FIG. 2 illustrates one arrangement in which three tabs 18, 28 and 30 are secured in place prior to assembly of the cells 10 into an array and FIG. 3 illustrates a second arrangement in which a single tab 18 is present, prior to assembly of the cells 70 into an array. When assembled into an array, the tabs 18 provide series connections to adjacent cells and the tabs 28 and 30 provide parallel connections to adjacent cells as will be explained. The cells of FIGS. 2 and 3 are shown rotated through a small angle, for example 23° about the cell centers relative to the orientation of FIG. 1 as this is their actual orientation when in an array, as also will be explained.

In FIG. 4, tab 18 is a "Z" shaped, relatively narrow sheet metal conductor having three sections, namely a first contact leg 22, a second contact leg 24 and a reverse bend portion 26. The contact leg 22 is soldered to the base region surface at pad 20 of the cells 10 and 70, FIGS. 2 and 3, prior to assembly of the cells into an array.

In FIG. 5, tab 28 comprises contact legs 32 and 34 joined to one another by a "U" shaped bend section 36. The leg 32 is soldered to pad 24 prior to assembly of the cells into an array. A leg 32' corresponding to leg 32 on contact tab 30 is soldered to pad 26 also prior to assembly of the cells into an array.

In FIGS. 2 and 3, the base region surface of cells 10 and 70 facing the viewer, has a grid structure which may comprise a peripheral bus conductor 19 (dashed) adjacent the cell edge and a plurality of radially extending spokes (not shown) extending from the peripheral bus conductor 19 and intersecting at the center of the cell. Other forms of grid structures (also not shown) may be employed instead. The grid structure is preferably deposited by silk screening. Solder pads 20, 24 and 26 are screened onto the base region surface adjacent to and in electrical contact with the conductor 19 and spaced around the periphery relative to the cell center, about 120° from each other. Pad 26 may overlap pad 16 on the opposite surface of the cell. Tabs 18 connect all cells in series via pads 20 and 16, FIG. 7, to form the columns (left to right in the drawing) of cells 10 and cells 70. The cell orientations in FIGS. 2 and 3 are rotated 90° counterclockwise to correspond to their orientations in FIG. 7. That is, in FIG. 7, the pads 16 of the cells are on the right of the corresponding cells. Prior to assembly, tab 18 is on the left. The solder pads 24 and 26 on cells 70 serve as parallel connection points to adjacent cells. During assembly of the array, tab 28 of cell 10 is soldered to pad 20 of a cell 70 in one column and tab 30 of cell 10 is soldered to pad 24 of a cell 70 in another column. The cells 70 have only the tabs 18 per-attached thereto prior to assembly into the array, FIG. 7.

FIG. 6 illustrates apparatus for soldering the tabs 18, 28 and 30 to a cell. A work table 36 supports cell 10 (or cell 70) and tabs 28, 30 and 18 (not shown) or 18 by itself, as the case may be. The work table comprises a lower support 38 and an upper support 40 secured by screws (not shown). O-rings 42, 44 and 46 seal manifolds 50, 52 and 54 from the ambient and are coupled to a vacuum source through conduit 56. Sponge rubber sheet 58 overlies support 40.

The sheet 58 includes spaced apertures 60, 62, 64, 66 and 68. The apertures 60, 62 are coupled to manifold 50 and the vacuum created at these apertures holds the tab 28, FIG. 5, in place via respective legs 32 and 34. The vacuum at apertures 60 and 62 holds the legs 32 and 34, respectively, in place against the sponge rubber sheet 58. Aperture 64 is coupled to the central portion of cell 10 and the vacuum there forces cell 10 against the sponge rubber sheet 58. Tab 30 is held against the sponge rubber sheet 58 by the vacuum at apertures 66 and 68 in a manner similar to that of tab 28. Leg 22 is placed over pad 20 and leg 32 of tabs 28 and 30 are respectively placed over pads 24 and 26 (not shown in FIG. 6) to form cell 10.

In operation, the vacuum is applied to manifolds 50, 52 and 54. Radiant heat lamps 62 above the work table 36 are turned on and radiantly heat the solder pads, reflowing the solder and connecting the tabs 18, 28 and 30 to their respective solder pads. The vacuum, by means of the pressure differential with atmospheric pressure, forces the cell against the tabs squeezing excess solder from between the tabs and the solar cell, providing a smooth surface at the location of the pads. The sponge rubber sheet 58 is a thermal insulator and causes concentration of the thermal energy at the cells and tabs. After assembly of the tabs to the cells, the tabbed cells are placed on work table 72, FIG. 7.

In FIG. 7, work table 72 comprises a board 74 in which there are a plurality of vacuum apertures 76 coupled to a manifold (not shown) within the board 74, the manifold terminating at an input port 81 which is coupled to a vacuum source 78 via line 80. The line 80 is connected to the board input port by releaseable connector 82. In the alternative, line 80 may be connected to port 81 through a valve (not shown).

The equally spaced parallel lines 84 indicate the orientation in which the tabs 18 of the cells of FIGS. 2 and 3 will appear when the cells are assembled into an array. Surrounding each of ports 76 is a circle 77 (dashed) which coincides with the cell wafer periphery to assist manually aligning the wafers in the array. Each cell wafer is assembled within a circle 77. The circles 77 are drawn on board 74 in the desired array configuration. To assemble the array, first a zig-zag or "W" shaped bus bar 73 is placed on board 74. Bus bar 73 has tabs 18 presoldered to it at the positions over which the pads 16 of the various cells are to be placed in alignment with lines 84. The bus bar 73 may be a thin copper foil having the shape as shown. Eventually this bus bar will be connected to a connector for extracting the power generated by the array. A second bus bar (not shown) is also in place to complete the circuit. A thin black anodized aluminum sheet (not shown) is placed over the bus bar 73. This sheet serves as a holder and the black anodized sheet helps absorb heat during soldering to equalize the temperature between the bus bar 73 and the cells. The long axis of the tabs 18 on the various cells are aligned over lines 84. The cell wafers are placed over the apertures 76 centered in circles 77. The board 74 also includes four guide apertures 88 for a purpose to be described. The cells 70 are placed on the work table 72 first in a set of columns as shown in FIG. 7. The cells 70 of FIG. 3 are placed in the alternate columns sequentially in the direction 90 with the tab 18 on the left of that cell. The cells 10, FIG. 2, are also placed sequentially, alternating with the columns of cells 70 as shown, also with the tab 18 on the left. Cell 92 is then placed first and cell 94 represents at this stage the last placed cell of the four cells shown in the column. Each cell in all of the columns are placed in this sequence. As each cell is placed on the work table 74, the pad 16 (FIGS. 2, 3) of that cell overlies leg 24 on tab 18 of the previously placed adjacent cell in that column.

The tabs 28 and 30 form parallel connections while the tabs 18 form series connections in the array as discussed above. The columns of cells 70 are placed first and then the columns of cells 10 are placed second. In the alternative, the first cell 70 of one set of columns (call it row 1) may be put in place first and then the first cell 10 of the other set of alternate columns (call it row 2) may be put in place and this sequence repeated for the entire array.

As discussed above, the cells 10 and 70 of FIGS. 2 and 3 are turned counterclockwise from the orientation of FIGS. 2 and 3. This orientation offsets the tabs 18, 28 and 30 from a diametrical line through the centers of the cells. This offset positions the tabs at a location spaced from the points closest to their points of tangency. This location is one at which the wafers of the cells are spaced a small distance from each other providing room for the reverse bend 26 of tab 18, FIG. 4 and bend 36 of tabs 28 and 30, FIG. 5. If the tabs were placed at the closest points of tangency between the cells along the diametrical lines then a possible short circuit might occur between the emitter and base regions of adjacent cells. This arrangement is explained in more detail in the above-mentioned copending application.

At a time prior to the cells being placed on the work table 74, a vacuum is applied to table 74 so that each cell may be firmly held in place after being put there. After all cells in the array are in place, the support 74 with the cells thereon is placed upside down over the fixture 100, FIG. 8, so that the grids 12 of the cells, FIG. 1, face upward for reasons to be explained.

In FIG. 8, fixture 100 includes an array support 102 having a plurality of vacuum apertures 104 of the same shape and in the same position as the apertures 76 of the table 72, FIG. 7. These apertures are coupled to a manifold 106, having output port 108 which is connected to the vacuum source 78, FIG. 7, via connector 82. The conduit 80 is a flexible hose which permits the movement of the table 72 with respect to the source 78, which may be fixed in place.

The support 102 comprises a sponge rubber layer 110 mounted on a wood or metal frame 112. The frame 112 is fixed to a permanent support 114. The frame 112 has secured thereto a plurality of guide pins 116 for the apertures 88, FIG. 7. When the table 72 is in place over support 102 with apertures 88 and guide pins 116 aligned, the vacuum ports 76 are aligned with the vacuum ports 104. Overhead is a radiant heating system 120 comprising radiant lamps 122 mounted on a movable carriage 124 which traverses in directions 126. The carriage 114 is moved in directions 126 by a pulley system 128 connected to electric motor 129.

Support 74, FIG. 7, with the cells secured thereto by vacuum, is transported over the table 112 with the cells underneath and facing table 112. This inverts the cells 10 and 70. When the apertures 88 are aligned with the guide pins 116, the support 74 is placed with the cells against the sponge rubber layer 110, FIG. 8. The support 74, FIG. 7, is thus secured in place by the guide pins 116 and gravity. At this time, the connector 82 is disconnected, FIG. 7, and the vacuum source 78 is connected to the port 108, FIG. 8. In the alternative, a valve (not shown) decouples board 74 from the vacuum and couples the vacuum to table 112. This removes the vacuum from the support 74 and applies the vacuum to the manifold 100 in table 112 and thus ports 104 which causes the cells 10 and 70 to be forced by ambient pressure against the sponge rubber layer 110. The cells are thus held in place firmly and securely by the vacuum and the configuration of the array is maintained precisely. The lamps 122 are, of course, spaced sufficiently above the table 112 to permit the above steps. A reason for using the board 74 of FIG. 7 is that the lines 84 and circles 77 cannot be accurately formed such as by scribing on rubber layer 110. Also, by reversing the position of the cells on the board 74 to that on table 112 inverts the relative position of the tabs to beneath the cells. With the cells over the tabs, the cells tend to hold the tabs in place during soldering. Further, since the tabs may be made of foil they are relatively pliable. The cells tend to hold the tabs flat against the rubber sheet 110 and thereby provide good contact between the tabs and the solder pads during soldering.

In FIG. 9, the pulley system 128 of FIG. 8 is not shown. Secured to the table 112 are a plurality of thin plastic sheets 120. These may be made out of Kapton, a trademark of DuPont, which is a polyimide high strength, relatively thin plastic film or other similar material. The sheets 120 form parallel strips which are hinged at end 122 to the frame 112 and are attached at the other end to a spring 124. The spring 124 is hooked onto a hook 126 on strip 128 secured to the support 114.

The Kapton strips 120 overlay the array and tab assembly and force the cells and tabs against the sponge rubber sheet 110, FIG. 8. This ensures the tabs do not pop up or become disengaged during the heating and soldering operation. The strips 120 are high temperature material which easily withstand the elevated soldering temperatures.

At this time, the lamps are traversed in directions 126 over the solar cell array and radiation from the lamps heats the cells and the solder, melting the solder and connecting the tabs. As the solder melts the pressure of the sheets 120 causes solder to flow from between the connections providing a smooth, clean connection. No significant solder lumps are formed. This ensures a thin solder layer for subsequent lamination of the assembly between glass sheets (not shown).

Upon completion of the solder operation described above the lamps are then traversed out of the way, the radiation turned off, and the vacuum removed. The solar cell array is complete and can be handled as an integral unit.

The bends 26 and 36 of the tabs provide stress relief. As the cells are thermally cycled, changes in dimensions cause contraction and expansion of the cells and the glass laminates (not shown) with respect to each other. The stress relief portions of the interconnect tabs absorb these changes in dimensions and prevent stress cracking of the cells during the thermal cycle.

What is claimed is:

1. A method of fabricating a solar cell array in which each cell is pretabbed comprising:
   assembling the tabbed cells in a predetermined array with at least part of each tab facing upward, each tab being fixed to a bonding pad on one cell and abutting a bonding pad on an adjacent cell;
   holding the cells in place with a first vacuum support means;
   inverting the array onto a second vacuum support means which holds the tabs firmly against the pads they abut; and
   applying heat to the array for bonding the tab portions not already fixed to bonding pads to these pads.

2. The method of claim 1 wherein said inverting step includes squeezing said cells against said tabs to squeeze excess solder from therebetween.

3. The method of claim 1 wherein said applying heat step includes squeezing said cells against said tabs, heating said array to melt solder between said cells and tabs, and removing excess solder by said squeezing.

4. The method of claim 3 wherein said heating step includes the step of heating said cells sequentially.

5. The method of claim 1 wherein said assembling step includes placing some of said cells in said array sequentially in a first plurality of spaced columns and then the remaining cells sequentially in a second plurality of spaced columns between the first plurality.

6. The method of claim 1 wherein said holding step includes holding each cell in a predetermined position with a vacuum.

7. The method of claim 1 wherein said assembling step includes aligning a first tab to one set of cells in a first configuration and second, third, and fourth tabs to a second set of cells in a second configuration.

8. The method of claim 7 wherein said aligning step includes placing the cells of said one set sequentially into said array first and the cells of said second set sequentially into said array second, and forcing said cells against said first support means after the placing of each cell into its array position.

* * * * *